(12) United States Patent
Teng

(10) Patent No.: US 8,623,586 B2
(45) Date of Patent: Jan. 7, 2014

(54) METHOD FOR ON-PRESS DEVELOPABLE LITHOGRAPHIC PLATE UTILIZING LIGHT-BLOCKING MATERIAL

(76) Inventor: Gary Ganghui Teng, Northborough, MA (US)

( * ) Notice: Subject to any disclaimer, the term of this patent is extended or adjusted under 35 U.S.C. 154(b) by 1149 days.

(21) Appl. No.: 12/393,033

(22) Filed: Feb. 25, 2009

(65) Prior Publication Data

US 2010/0216074 A1    Aug. 26, 2010

(51) Int. Cl.
*G03F 7/00*    (2006.01)
*B41F 1/18*    (2006.01)

(52) U.S. Cl.
USPC ........................................ 430/302; 101/450.1

(58) Field of Classification Search
USPC ................. 430/270.1, 273.1, 302; 101/463.1, 101/450.1
See application file for complete search history.

(56) References Cited

U.S. PATENT DOCUMENTS

| | | | |
|---|---|---|---|
| 3,804,736 A * | 4/1974 | Pasternack | 522/41 |
| 4,396,284 A * | 8/1983 | Fromson et al. | 355/100 |
| 5,607,816 A | 3/1997 | Fitzgerald et al. | 430/271.1 |
| 5,910,395 A | 6/1999 | Li et al. | 430/302 |
| 6,136,503 A | 10/2000 | Zheng et al. | 430/270.1 |
| 6,153,356 A | 11/2000 | Urano et al. | 430/281.1 |
| 6,232,038 B1 | 5/2001 | Takasaki et al. | 430/281.1 |
| 6,309,792 B1 | 10/2001 | Hauck et al. | 430/270.1 |
| 6,331,375 B1 | 12/2001 | Kawamura et al. | 430/270.1 |
| 6,482,571 B1 | 11/2002 | Teng | 430/302 |
| 6,576,401 B2 | 6/2003 | Teng | 430/303 |
| 6,689,537 B2 | 2/2004 | Urano et al. | 430/273.1 |
| 6,740,464 B2 | 5/2004 | Maemoto | 430/138 |
| 6,881,532 B2 | 4/2005 | Suzuki | 430/302 |
| 7,883,826 B2 * | 2/2011 | Beckley et al. | 430/270.1 |
| 2003/0186165 A1 | 10/2003 | Gries et al. | 430/281.1 |
| 2005/0164121 A1 * | 7/2005 | Anzures et al. | 430/270.1 |
| 2007/0254241 A1 * | 11/2007 | Teng | 430/302 |
| 2009/0035694 A1 | 2/2009 | Nguyen et al. | 430/273.1 |
| 2009/0123872 A1 * | 5/2009 | Deutsch et al. | 430/302 |

* cited by examiner

*Primary Examiner* — Cynthia H Kelly
*Assistant Examiner* — Connie P Johnson

(57) ABSTRACT

A method for applying a light-blocking material onto an imagewise exposed lithographic printing plate is disclosed. The exposed plate comprises on a substrate a photosensitive layer having hardened areas and non-hardened areas (for negative plate) or solubilized areas and non-solubilized areas (for positive plate). The non-hardened or solubilized areas of said photosensitive layer are removable with ink and/or fountain solution on a lithographic press. The light-blocking material is applied to the plate preferably from a solution or dispersion containing such material. The application of the light-blocking material prevents at least a portion of the room light in a certain wavelength (such as ultraviolet) range from reaching the photosensitive layer, thus allowing improved room light stability of the exposed plate.

9 Claims, No Drawings

METHOD FOR ON-PRESS DEVELOPABLE LITHOGRAPHIC PLATE UTILIZING LIGHT-BLOCKING MATERIAL

FIELD OF THE INVENTION

This invention relates to lithographic printing plate. More particularly, it relates to a method of applying a light-blocking material to an on-press developable lithographic plate after imagewise exposure and before on-press development with ink and/or fountain solution.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate.

Traditionally, the plate is exposed with an ultraviolet light from a lamp through a separate photomask film having predetermined imaging pattern that is placed between the light source and the plate. Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm). Laser sensitive plates generally have higher sensitivity (than conventional plates) because of the limited power of current laser imagers.

Conventionally, the exposed plate is developed with a liquid developer to bare the substrate in the non-hardened or solubilized areas. On-press developable lithographic printing plates have been disclosed in recent years. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

An on-press developable plate is designed to be developed on a lithographic printing press in a pressroom, which is generally under regular office light (white light). The imagewise exposed plate typically sees the white light during the handling and on-press development. Therefore, the plate must be designed so that it is stable enough under regular office light within a certain time period (such as 30 minutes). Plates that are not stable enough under regular office light are not suitable for on-press development application in the common pressroom lighting condition. Such an office light stability requirement makes it very difficult to design an on-press developable plate with fast photospeed or suitable for laser exposure.

There has been a desire to develop a method that would eliminate the office light stability requirement of an on-press developable plate after imagewise exposure and before on-press development.

SUMMARY OF THE INVENTION

According to the present invention, there has been provided a method of lithographically printing images on a receiving medium, comprising in order:
 (a) providing a lithographic printing plate comprising on a substrate a photosensitive layer capable of hardening (for negative plate) or solubilization (for positive plate) upon exposure to a radiation, the non-hardened or solubilized areas of said photosensitive layer being soluble or dispersible in ink and/or fountain solution;
 (b) imagewise exposing said plate with said radiation to cause hardening or solubilization of said photosensitive layer in the exposed areas;
 (c) applying a light-blocking material onto said plate on at least the photosensitive layer coated side, wherein said light-blocking material as applied to said plate prevents at least a portion of light within the wavelength range of from 200 to 780 nm from reaching said photosensitive layer;
 (d) developing said plate with ink and/or fountain solution on a lithographic press to remove the non-hardened or solubilized areas of said photosensitive layer; and
 (e) lithographically printing images from said plate to the receiving medium.

The radiation is preferably a laser having a wavelength selected from 200 to 1200 nm, more preferably a violet or ultraviolet laser (200 to 430 nm) or an infrared laser (750 to 1200 nm), most preferably a violet or ultraviolet laser. The plate can be a negative plate or positive plate, preferably a negative plate.

Preferably, the light-blocking material as applied to said plate prevents at least 50%, more preferably at least 90% and most preferably at least 99%, of light in the wavelength range of from 300 to 450 nm from reaching said photosensitive layer. Here, the term reaching the photosensitive layer means reaching the top of the photosensitive layer. In the case that the light-blocking material also diffuses into the photosensitive layer, the light-blocking material prevents more light from reaching the bottom of the photosensitive layer than from reaching the top of the photosensitive layer; it is preferable that the light-blocking material as applied to said plate prevents at least 90% of light in the wavelength range of from 300 to 450 nm from reaching the bottom of said photosensitive layer.

The light-blocking material is applied to the plate on at least the photosensitive layer coated side by any means, preferably from a solution or dispersion, more preferably an aqueous solution or dispersion. The plate applied with the light-blocking material from a solution or dispersion is preferably dried to remove any excess water and/or organic solvent so that the plate is free of any wet-looking surface, after application of said solution or dispersion and before said on-press development.

The light-blocking material, by itself or together with other materials applied with said light-blocking material, can form a thin layer on said plate, or can diffuse into the photosensitive layer, and/or overcoat if any. Alternatively, a portion of said light-blocking material, by itself or together with other materials applied with said light-blocking material, forms a thin layer on said plate, and the rest of said light-blocking material diffuses into the photosensitive layer, and/or overcoat if any. Preferably, the light-blocking material forms a thin layer on said plate on at least the photosensitive layer coated side, with or without part of the light-blocking material diffusing into the photosensitive layer and/or overcoat.

The light-blocking material can be any material capable of blocking (usually by absorbing and/or scattering) light in a certain wavelength range in the ultraviolet and visible regions. Preferably, the light-blocking material is capable of blocking light in the ultraviolet region (more preferably from 300 to 450 nm), and is substantially transparent in most of the visible region (more preferably from 500 to 780 nm). More preferably, the light-blocking material is an ultraviolet light absorbing dye or ultraviolet absorbing and/or scattering pigment, or a combination of such dye and pigment. Most preferably, the light-blocking material is a dye or pigment, or combination of such dye and pigment, having an absorption maximum or a scattering peak within the wavelength range of from 300 to 450 nm. Such light-blocking material is preferably applied to the plate through a solution or dispersion containing such light-blocking material.

DETAILED DESCRIPTION OF THE PREFERRED EMBODIMENTS

In this patent, the term development means selective removal of the non-hardened (for negative plate) or solubilized (for positive plate) areas of the photosensitive layer (without removing the hardened or non-solubilized areas). The term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term "comprises a . . . " means "comprises at least one . . . "; for example, the term "comprising a monomer" means "comprising at least one monomer." The term yellow or red light means yellow light, red light, or any light with color between yellow and red such as orange light. The term safe light means a light with a certain wavelength range being cut off so that it does not cause hardening (for negative plate) or solubilization (for positive plate) of a certain photosensitive layer at least within a certain amount of time required for certain typical handling and process (such as 2 hours). For most photosensitive layer, a safe light is a yellow or red light. The term white light means a white fluorescent light, white incandescent light, sunlight, or any regular office light. The term "substantially no radiation" means the intensity of the radiation is less than 1% of that for a regular 100-watt incandescent light (for home use, not focused) at a distance of 2 meters. The term "substantial darkness" means the intensity of the radiation is less than 1% of that for a 100-watt incandescent light at a distance of 2 meters. The term "substantially light-tight" means less than 1% of the light can pass through. The term "substantially no room light reaches the plate" means less than 1% of the room light reaches the plate.

The laser exposure and application of the light-blocking material of this invention are preferably performed with the plate in substantial darkness or under lightings that will not cause hardening or solubilization of the photosensitive layer at least within a limited time (such as less than 60 minutes) required for handling and processing the plate before applying the light-blocking material. More preferably, these are performed with the plate under a yellow or red light, under a white light for less than 30 minutes (more preferably less than 10 minutes), or in darkness or substantial darkness. Most preferably, these are performed with the plate under a yellow or red light, or in darkness or substantial darkness. The laser exposure and the application of the light-blocking material can be performed with the plate under the same or different lightings (including darkness). The lighting can be the room light when the plate is open to the room light, or can be the lighting (including darkness) within the covers when the imager and/or light-blocking material application device is shielded with covers.

During the manual or automatic handling before application of the light-blocking material, the plate is preferably under a yellow or red light (such as open to a yellow or red room light or shielded with yellow or red light-passing-only covers), under a white light for less than 30 minutes (more preferably less than 10 minutes), and/or in darkness or substantial darkness (such as shielded with light-tight or substantially light-tight covers); and more preferably under a yellow or red light and/or in darkness or substantial darkness. During the manual handling before application of light-blocking material, the plate is preferably open to a yellow or red room light, or open to a white room light for less than 30 minutes (more preferably less than 10 minutes); and more preferably open to a yellow or red light. During the automatic handling before application of light-blocking material, the plate is preferably shielded with covers (which are substantially light-tight or yellow or red light-passing-only), open to a yellow or red room light, or open to a white room light for less than 30 minutes (more preferably less than 10 minutes); and more preferably shielded with light-tight or substantially light-tight covers.

Before being applied with light-blocking material, the exposed plate is preferably handled and/or stored in darkness or substantial darkness (such as in a light-tight or substantially light-tight box, wrap or cassette), under white light for limited time (such as less than 30 minutes), or under a yellow or red light (preferably for limited time, such as less than 2 hours). More preferably, the plate is handled and/or stored in darkness or substantial darkness, or under a yellow or red light for limited time (such as less than 2 hours, preferably less than 1 hour). Most preferably, the plate is stored in darkness, and handled in darkness or substantial darkness or under a yellow or red light. The time allowable under white light or yellow or red light depends on the particular plate; for example, some plates are unsafe under regular office light for even 1 second, some plates are safe under regular office light for up to 10 minutes, some plates are safe under a yellow or red light for up to 60 minutes, and some plates are safe under a yellow or red light for more than 2 hours. Here the term safe means maintaining acceptable performance.

The on-press development can be performed with the plate under any visible light, preferably under a white room light. The press is preferably in a pressroom with white light, and the plate mounted on the plate cylinder of the press is preferably open to the white room light.

Various visible and ultraviolet absorbing dyes or pigments can be used as the light blocking materials of this invention. Preferred are dyes or pigments which can effectively block light in the wavelength range of from 200 to 550 nm, more preferably from 250 to 500 nm, and most preferably from 300 to 450 nm. It is noted that, for a dye, the reduction of the transmission of light is generally through absorption; and for a pigment, it is generally through both absorption and scattering. In other words, a dye generally blocks light by absorbing light in a certain wavelength range, and a pigment generally blocks light by both absorbing and scattering light in a certain wavelength range. For simplicity, in this application, a pigment which effectively absorbs and/or scatters light in the ultraviolet (or visible) region is also called an ultraviolet (or visible) absorbing pigment.

The light-blocking material can be applied to the lithographic plate by any means, preferably from a solution or dispersion containing such light-blocking material, and more preferably from an aqueous solution or dispersion. The light-blocking solution or dispersion can be based on water and/or organic solvent as the solvent; preferably based on water, with or without addition of organic solvent; most preferably based on water, without addition of organic solvent.

The solution or dispersion containing the light-blocking material for applying to the plate after imagewise exposure and before development is called light-blocking solution or dispersion in this application. A preferred light-blocking solution or dispersion is an aqueous solution or dispersion comprising an ultraviolet light absorbing dye or pigment and at least 60% by weight of water. One or more water soluble polymers are preferably added into the light-blocking solution or dispersion. Other additives, such as surfactant, defoamer, bactericide, colorant, inorganic micro particles (such as talc or silicon oxide powder), organic micro particles (such as latex), and rheology modifier, can also be added.

The plate applied with the light-blocking material from a solution or dispersion is preferably dried to remove any excess water and/or organic solvent so that the plate is free of any wet-looking surface, after application of said solution or dispersion and before said on-press development. The plate can be dried by any means, such as by forced room temperature air, forced hot air, infrared heater, hot plate, and natural drying (by leaving uncovered at room temperature). Preferably, the plate is dried by forced hot air. Upon drying, the light-blocking solution or dispersion may form a dry layer on the plate on the photosensitive layer coated side; such a dry layer is called light-blocking layer in this application.

In addition to its capability of blocking light, the light-blocking solution or dispersion is preferably also capable of deactivating the photosensitive layer, changing the color of the photosensitive layer primarily or only in the non-hardened or solubilized areas, enhancing the hydrophilicity of the substrate, or increasing the on-press developability with ink and/or fountain solution. A deactivating agent, a discoloring agent, a hydrophilizing agent, or a development enhancer, may be added into the light-blocking solution or dispersion. Various deactivating agents, discoloring agents, hydrophilizing agents, and development enhancers are described in U.S. patent application Ser. Nos. 11/825,576 and 11/825,576, the entire disclosures of which are hereby incorporated by reference, and can be used as the deactivating agent, discoloring agent, hydrophilizing agent, or development enhancer of this invention.

The light-blocking solution or dispersion can be applied to the laser exposed plate on the photosensitive layer coated side either manually or automatically, preferably automatically on a light-blocking material application device. By manual application, preferably, a small portion (such as 5 to 50 g) of light-blocking solution or dispersion is poured onto the plate on the photosensitive layer coated side and then spread into a thin layer with a cloth, a sponge, a wire-wound rod, a roller, or the like by hand. By automatic application, preferably, the plate passes through a light-blocking material application device which is capable of applying the light-blocking solution or dispersion onto the plate on the photosensitive layer coated side; the light-blocking solution or dispersion can be applied to the plate on the device by any means, preferably by contacting with a roller carrying the light-blocking solution or dispersion, by dipping through the light-blocking solution or dispersion in a tank, or by spraying the light-blocking solution or dispersion onto the plate; the plate applied with the light-blocking solution is preferably further dried to remove any excess water or organic solvent by passing through a drying unit on the device, preferably a drying unit using forced hot air.

For the plate of this application, at least the hardened (for negative plate) or non-solubilized (for positive plate) areas of the photosensitive layer exhibit an affinity or aversion substantially opposite to the affinity or aversion of the substrate to at least one printing liquid selected from the group consisting of ink and an abhesive fluid for ink (including both plates with non-phase-switchable photosensitive layer and plates with phase-switchable photosensitive layer). Preferably, the photosensitive layer exhibits an affinity or aversion substantially opposite to the affinity or aversion of the substrate to at least one printing liquid selected from the group consisting of ink and an abhesive fluid for ink (as for plates with non-phase-switchable photosensitive layer, which can be wet plate or waterless plate). More preferably, the plate has a hydrophilic substrate and an oleophilic photosensitive layer (as for wet plate with non-phase-switchable photosensitive layer). An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an adhesive fluid for ink, and does not switch its affinity or aversion upon exposure to an actinic radiation. However, certain photosensitive layer exhibits substantially the same affinity or aversion as the substrate and is capable of switching to opposite affinity or aversion upon exposure to a radiation, as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric support. A surface coating may be coated to achieve desired surface properties. For wet plate, the substrate should have a hydrophilic surface (for oleophilic photosensitive layer) or oleophilic surface (for hydrophilic photosensitive layer); preferably, a wet lithographic plate has a hydrophilic substrate and an oleophilic photosensitive layer. For waterless plate, the substrate should have an oleophilic surface (for oleophobic photosensitive layer) or oleophobic surface (for oleophilic photosensitive layer).

Particularly suitable hydrophilic substrate for a wet lithographic plate is an aluminum support that has been grained and anodized, preferably with further hydrophilic treatment. Surface graining can be achieved by mechanical graining or brushing, chemical etching, and/or AC electrochemical graining. The grained aluminum is typically treated with a basic or acidic solution to remove the smut, and then subjected to an electrochemical anodization process utilizing an acid such as sulfuric acid and/or phosphoric acid. The roughened and anodized aluminum surface can be further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred hydrophilic polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature, preferably an elevated temperature. By electrochemical method, a DC or AC electricity is applied to the aluminum while passing through or immersed in the solution containing the hydrophilic material. Processes for surface graining, anodization, and hydrophilic treatment of aluminum in lithographic printing plate application are well known in the art, and examples can be found in U.S. Pat. Nos. 2,714,066, 4,153,461, 4,399,021, 5,368,974, and 6,555,205.

For preparing lithographic printing plates of the current invention, any photosensitive layer is suitable which is capable of hardening (for negative plate) or solubilization (for positive plate) upon exposure to a radiation having a wavelength selected from 200 to 1200 nm, and on-press removable with ink and/or fountain solution in the non-hardened or solubilized areas. Such photosensitive layer is preferably soluble or dispersible in ink and/or fountain solution in the non-hardened or solubilized areas. Here hardening means becoming insoluble and non-dispersible in ink and/or fountain solution (negative-working); and solubilization means becoming soluble or dispersible in ink and/or fountain solution (positive-working). In this invention, hardening or solubilization can be achieved through any means. Preferably, hardening is achieved through crosslinking or polymerization of polymers and/or monomers, and solubilization is achieved through decomposition of polymer and/or compound. The radiation can be a conventional light such as ultraviolet light from a lamp (which usually requires a photomask), or can be a laser (which directly images according to digital imaging information). Preferably, the photosensitive layer is sensitive to a laser and exposed with such laser. The photosensitive layer preferably has a coverage of from 100 to 3000 mg/m$^2$, and more preferably from 400 to 2000 mg/m$^2$.

Photosensitive layer suitable for the current invention may be formulated from various photosensitive materials to achieve on-press developability with ink and/or fountain solution. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. Addition of nonionic surfactant is especially helpful in making the photosensitive layer dispersible in and on-press developable with ink and/or fountain solution. Various additives useful for conventional photosensitive layer can also be used. These additives include pigment, dye, exposure indicator, and stabilizer.

Photosensitive materials useful for negative-working plates of this invention include, for example, photosensitive compositions comprising a (meth)acrylate monomer, a polymeric binder, and a free radical initiator; photosensitive compositions comprising a polyfunctional vinyl ether or epoxy monomer and a cationic initiator; and polycondensation products of diazonium salts.

Photosensitive materials useful for positive-working plates of this invention include, for example, photosensitive compositions comprising a novalac resin and a diazo-oxide compound such as a benzoquinone diazide or naphthoquinone diazide; photosensitive compositions comprising a novalac resin, an onium salt, and a sensitizing dye (such as an infrared absorbing dye); and photosensitive compositions comprising a novalac resin and an infrared absorbing dye.

Photosensitive materials useful for wet plates of this invention include, for example, photosensitive compositions comprising an oleophilic polymeric binder, a polymerizable monomer, an initiator, and a sensitizing dye.

Photosensitive oleophobic materials useful for waterless plates of this invention include, for example, compositions comprising polymers having perfluoroalkyl groups and crosslinkable terminal groups, and compositions comprising polysiloxane and crosslinkable resins.

Infrared laser sensitive (also called thermosensitive) materials useful for thermosensitive lithographic plates of this invention include, for example, thermosensitive compositions comprising a polymerizable monomer, an initiator, an infrared absorbing dye, and optionally a polymeric binder.

Visible or ultraviolet light sensitive materials useful for visible or ultraviolet laser sensitive plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. The polymer may or may not have (meth)acrylate groups or other ethylenic groups (such as allyl groups). Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Polymeric binders having polymer backbone with recurring units having pendant poly(alkylene glycol) side chains are particularly useful for the on-press developable plates of this invention. The polymeric binder preferably has a weight average molecular weight of at least 5,000, more preferably from 10,000 to 1,000,000, even more preferably from 20,000 to 500,000, and most preferably from 50,000 to 200,000 Dalton.

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth) acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth) acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer preferably has a molecular weight of less than 5,000, more preferably from 100 to 3,000, and most preferably from 200 to 2,000.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane)tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as butylammonium triphenyl(n-butyl) borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxystyryl)-s-triazine, 2,4-bis(trichloromethyl)-6-(4-methoxynaphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010, 824, and 5,629,354; titanocene compounds such as bis($\eta^9$-2, 4-cyclopentadien-1-yl)bis[2,6-difluoro-3-(1H-pyrrol-1-yl) phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 780 and 1100 nm.

Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzothiazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention preferably contains one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants may be added into the photosensitive layer to, for example, improve the coatability or developability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 10% by weight of the photosensitive layer, and more preferably from 0.5 to 5%.

A hydrophilic or oleophilic particulate dispersion may be added into the photosensitive layer to enhance, for example, the developability and non-tackiness of the plate. Suitable particulate dispersions include polymer micro particles, talc, titanium dioxide, barium sulfate, silicone oxide and aluminum micro particles, with an average particle size of less than 10 microns, preferably less than 5 microns, more preferably less than 2 microns and most preferably less than 1 microns. A suitable particulate dispersion is described in U.S. Pat. No. 6,071,675, the entire disclosure of which is hereby incorporated by reference.

For plates with rough and/or porous surface capable of mechanical interlocking with a coating deposited thereon, a thin water-soluble interlayer can be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is a preferred water-soluble polymer. Usually pure water-soluble polymer is coated. However, one or more surfactants and/or other additives (such as bactericide, defoamer, and water soluble dye) may be added. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A water soluble or dispersible overcoat can be coated on the photosensitive layer to, for example, improve the photospeed, surface durability, and/or on-press developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles (such as talc and polymer particles) can be added into the overcoat to, for example, reduce the tackiness or moisture sensitivity of the plate. The overcoat preferably has a coverage of from 0.001 to 4.0 $g/m^2$, more preferably from 0.01 to 2.0 $g/m^2$, and most preferably from 0.1 to 1.0 $g/m^2$.

A preferred thermosensitive lithographic printing plate of this invention comprises on a substrate a thermosensitive layer comprising a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably at least 1.5, and most preferably at least 2.0.

Another preferred thermosensitive lithographic plate of this invention comprises on a substrate a thermosensitive layer comprising a polymeric binder, a urethane (meth)acrylate monomer having at least 4 (meth)acrylate groups, a free-radical initiator, and an infrared absorbing dye.

Yet another preferred thermosensitive lithographic plate of this invention comprises on a substrate a thermosensitive layer comprising a polymeric binder having polymer backbone with recurring units having pendant poly(alkylene glycol) side chains, a (meth)acrylate monomer having at least one (meth)acrylate group, a free-radical initiator, and an infrared absorbing dye.

Further another preferred thermosensitive lithographic plate of this invention comprises on a substrate a thermosensitive layer comprising a polymeric binder and an infrared absorbing dye or pigment (preferably infrared absorbing dye); said thermosensitive layer is developable with ink and/or fountain solution and capable of hardening through crosslinking of the polymeric binder upon exposure to an infrared laser. A nonionic surfactant and/or a water-soluble polymer are preferably added in the thermosensitive layer. Other additives such as other surfactant, dye or pigment, and exposure indicating dye can also be added.

Yet fiber another preferred thermosensitive lithographic plate of this invention comprises on a substrate a thermosensitive layer comprising polymeric particles and an infrared absorbing dye or pigment (preferably infrared absorbing dye); said thermosensitive layer is developable with ink and/or fountain solution and capable of hardening through coalescence of the polymer particles upon exposure to an infrared laser. A nonionic surfactant and/or a water-soluble polymer are preferably added in the thermosensitive layer. Other additives such as other surfactant, dye or pigment, and exposure indicating dye can also be added.

A preferred visible light sensitive lithographic printing plate of this invention comprises on a substrate a photosensitive layer comprising a polymeric binder, a polymerizable ethylenically unsaturated monomer, a free-radical initiator, and a visible light sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

A preferred violet or ultraviolet light sensitive lithographic printing plate of this invention comprises on a substrate a photosensitive layer comprising a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

Another preferred violet or ultraviolet light sensitive lithographic plate of this invention comprises on a substrate a photosensitive layer comprising a polymeric binder, a monomer having at least 3 (meth)acrylate group, a hexaarylbiimidazole or titanocene compound, a dialkylaminobenzophenone compound, and a hydrogen donor. The weight ratio of all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

Yet another preferred violet or ultraviolet light sensitive lithographic plate of this invention comprises on a substrate a photosensitive layer comprising a polymeric binder, a urethane monomer having at least 4 (meth)acrylate group, a hexaarylbiimidazole or titanocene compound, a dialkylaminobenzophenone compound, and a hydrogen donor. The weight ratio of all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

Further another preferred violet or ultraviolet light sensitive lithographic plate of this invention comprises on a substrate a photosensitive layer comprising a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor. The weight ratio of all the urethane (meth)acrylate monomera to all the non-urethane (meth)acrylate monomers is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

Yet further another preferred violet or ultraviolet light sensitive lithographic plate of this invention comprises on a substrate a photosensitive layer comprising a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A hydrogen donor is preferably added. Other additives such as surfactant, dye or pigment, exposure-indicating dye, and free-radical stabilizer may be added.

The on-press developable lithographic plates and on-press developable photosensitive compositions as described in U.S. Pat. Nos. 6,482,571, 6,576,401, 5,548,222, 6,541,183, and 7,213,516, and U.S. patent application Ser. Nos. 10/720,882, 11/075,663, 11/175,518, 11/336,132, 11/356,911, 11/504,565, 11/595,468, 11/645,376, and 11/826,576, the entire disclosures of which are hereby incorporated by reference, can be used for the instant invention.

Infrared lasers useful for the imagewise exposure of the thermosensitive plates of this invention include laser sources emitting in the near infrared region, i.e., emitting in the wavelength range of from 750 to 1200 nm, and preferably from 800 to 1100 nm. Particularly preferred infrared laser sources are laser diodes emitting around 830 nm or a Nd/YAG laser emitting around 1060 nm. The plate is exposed at a laser dosage that is sufficient to cause hardening or solubilization in the exposed areas but not high enough to cause substantial thermal ablation. The exposure dosage is preferably from 1 to 500 mJ/cm$^2$, more preferably from 10 to 300 mJ/cm$^2$, and most preferably from 50 to 200 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively lower cost. The exposure dosage is preferably from 0.001 to 2 mJ/cm$^2$ (1 to 2000 µJ/cm$^2$), more preferably from 0.005 to 0.4 mJ/cm$^2$ (5 to 400 µJ/cm$^2$), and most preferably from 0.02 to 0.20 mJ/cm$^2$ (20 to 200 µJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.001 to 2 mJ/cm$^2$ (1 to 2000 µJ/cm$^2$), more preferably from 0.005 to 0.4 mJ/cm$^2$ (5 to 400 µJ/cm$^2$), and most preferably from 0.02 to 0.20 mJ/cm$^2$ (20 to 200 µJ/cm$^2$), depending on the sensitivity of the photosensitive layer.

Among the visible and ultraviolet lasers, violet or ultraviolet laser with a wavelength selected from 200 to 430 nm is particularly useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The plate is exposed on an exposure device, applied with a light-blocking material preferably on a light-blocking material application device, and then mounted on press to develop with ink and/or fountain solution and then print out regular printed sheets. Preferably, the plate is under a safe light or in substantial darkness during imagewise exposure and application of the light-blocking material, and is under white light during on-press development and printing. The ink and/or fountain solution solubilized or dispersed photosensitive layer (and overcoat if any) can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. The type of fountain solution used depends on the type of the plate substrate as well as the photosensitive layer. Various fountain solution compositions are described in U.S. Pat. Nos. 4,030,417 and 4,764,213.

The plate of this invention is on-press developed with ink and/or fountain solution. Preferably, the plate is a wet plate which is on-press developed with ink and/or fountain solution, or a waterless plate which is on-press developed with ink. More preferably, the plate is a wet plate which is on-press developed with ink and/or fountain solution. Most preferably, the plate is a wet plate with oleophilic photosensitive layer and hydrophilic substrate and is on-press developed with both ink and fountain solution.

This invention is further illustrated by the following non-limiting examples of its practice.

EXAMPLES 1-2

An electrochemically grained, anodized, and polyvinylphosphonic acid treated aluminum sheet was first coated with a 0.1% aqueous solution of polyvinyl alcohol (Airvol 540, from Air Products) with a #6 Meyer rod, followed by drying in an oven at 100° C. for 2 main. The polyvinyl alcohol coated substrate was further coated with the photosensitive layer formulation PS-1 with a #6 Meyer rod, followed by drying in an oven at 90° C. for 2 min.

| PS-1 | |
|---|---|
| Component | Weight ratios |
| Neocryl B-728 (Polymer from Zeneca) | 2.75 |
| Sartomer SR-399 (Acrylic monomer form Sartomer) | 6.56 |
| Pluronic L43 (Nonionic surfactant from BASF) | 0.56 |
| 2,2-Bis(2-chlorophenyl)-4,4',5,5'-tetraphenyl-1,1'-biimidazole | 1.21 |
| 4,4'-Bis(diethylamino)benzophenone | 0.77 |
| 2-Mercaptobenzoxazole | 0.15 |
| 2-Butanone | 88.00 |

The photosensitive layer coated plate was further coated with a water-soluble overcoat OC-1 using a #6 Meyer rod, followed by drying in an oven at 100° C. for 2 min. All the coatings were performed under a red light and the plate was then stored in a light tight box.

| OC-1 | |
|---|---|
| Component | Weight (g) |
| Airvol 203 (polyvinyl alcohol from Air Products) | 4.90 |
| Dioctyl sulfosuccinate sodium salt (surfactant) | 0.10 |
| Water | 95.00 |

The plate was exposed with a violet plate imager equipped with a 60 mw violet laser diode emitting at about 405 nm (MAKO-8 from ECRM) for a dosage of about 90 µJ/cm$^2$. The plate was imaged in an orange light room (with filtered fluorescent lamps Fuji Yellow FV30 from Encapsulite), and was kept in a light tight box before and after imaging.

Half of the above laser exposed plate was applied with a layer of NO-AD Maximum Sun Block Lotion (SPF 45 for UVA and UVB, from Solar Cosmetic Labs, Inc., Miami Lakes, Fla.), with the other half not applied with anything. The application of the sun block lotion was performed under red light.

The plate was then tested on a lithographic press (AB Dick 360) under white fluorescent light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The half of the plate applied with the sun block lotion showed clean background in the laser non-exposed areas and good inking in the laser exposed areas. In contrast, the half of the plate not applied with the sun block lotion showed inked surface in both exposed and non-exposed areas.

EXAMPLES 3-4

An electrochemically grained, anodized and polyvinylphosphonic acid treated aluminum substrate was coated with a thermosensitive layer formulation PS-2 with a #6 Meyer rod, followed by drying in an oven at 100° C. for 2 min.

| PS-2 | |
|---|---|
| Component | Weight (g) |
| Neocryl B-728 (Polymer from Zeneca) | 2.50 |
| Ebecryl 220 (Acrylate monomer from UCB Chemicals) | 5.99 |
| Pluronic L43 (Nonionic surfactant from BASF) | 0.40 |
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-1 using a #6 Meyer rod, followed by hot air blow drying and baking in an oven at 100° C. for 2 min. The plate was coated and handled under a yellow room light.

The coated plate was exposed with an infrared laser imager equipped with laser diodes emitting at about 830 nm (Lotem 400 from Creo) at a dosage of about 300 mJ/cm$^2$. The exposed areas of the plate showed brown color, while the non-exposed areas remain light green.

Half of the above laser exposed plate was applied with a layer of NO-AD Maximum Sun Block Lotion (SPF 45 for UVA and UVB, from Solar Cosmetic Labs, Inc., Miami Lakes, Fla.), with the other half not applied with anything. The plate was further exposed to the white room light (from white fluorescent lamps with 80 watts in total) for 2 hours.

The plate was then tested on a lithographic press (AB Dick 360) under white fluorescent light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The half of the plate applied with the sun block lotion showed clean background in the laser non-exposed areas and good inking in the laser exposed areas. In contrast, the half of the plate not applied with the sun block lotion showed background toning in the laser non-exposed areas and good inking in the laser exposed areas.

I claim:
1. A method of lithographically printing images on a receiving medium, comprising in order:
  (a) providing a lithographic plate comprising on a substrate a photosensitive layer capable of solubilization upon exposure to a laser having a wavelength selected from 200 to 1200 nm, the solubilized areas of said photosensitive layer being soluble or dispersible in ink and/or fountain solution;
  (b) imagewise exposing said plate with said laser to cause solubilization of said photosensitive layer in the exposed areas;

(c) applying a light-blocking material onto said plate on at least the photosensitive layer coated side, wherein said light-blocking material as applied to said plate prevents at least 90% of light in the wavelength range of from 300 to 450 nm from reaching said photosensitive layer; wherein said light-blocking material is a dye, a pigment or a combination of at least one dye and/or at least one pigment, capable of blocking light in the wavelength range of from 300 to 450 nm and is transparent to most of the wavelength range of visible light (d) developing said plate with ink and/or fountain solution on a lithographic press to remove the solubilized areas of said photosensitive layer; and (e) lithographically printing images from said plate to the receiving medium.

2. The method of claim 1 wherein said light-blocking material as applied to said plate prevents at least 99% of light in the wavelength range of from 300 to 450 nm from reaching said photosensitive layer.

3. The method of claim 1 wherein said light-blocking material as applied to said plate prevents at least 90% of light in the wavelength range of from 300 to 450 nm from reaching said photosensitive layer and is transparent in the wavelength range of from 500 to 780 nm.

4. The method of claim 1 wherein said light-blocking material, by itself or together with other materials applied with said light-blocking material, forms a thin layer on said plate, with or without part of said light-blocking material diffusing into the photosensitive layer, and/or overcoat.

5. The method of claim 1 wherein said light-blocking material is applied from an aqueous solution or dispersion comprising an ultraviolet light absorbing dye and/or pigment and a water soluble polymer.

6. The method of claim 1 wherein said plate further includes a water soluble or dispersible overcoat on said photosensitive layer.

7. The method of claim 1 wherein said laser is an infrared laser having a wavelength selected from 750 to 1200 nm.

8. The method of claim 1 wherein said laser is a violet or ultraviolet laser having a wavelength selected from 200 to 430 nm.

9. A method of lithographically printing images on a receiving medium, comprising in order:
  (a) providing a lithographic plate comprising on a substrate a photosensitive layer capable of hardening or solubilization upon exposure to a laser having a wavelength selected from 200 to 1200 nm;
  (b) imagewise exposing said plate with said laser to cause hardening or solubilization of the photosensitive layer in the exposed areas;
  (c) depositing a light-blocking layer onto said plate on the photosensitive layer coated side, said light-blocking layer being soluble or dispersible in ink and/or fountain solution and capable of preventing at least 50% of light in the wavelength range of 300 to 450 nm from reaching said photosensitive layer;
  (d) developing said plate with ink and/or fountain solution on a lithographic press to remove said light-blocking layer and the non-hardened or solubilized areas of said photosensitive layer; and
  (e) lithographically printing images from said plate to the receiving medium;
  (f) wherein said light-blocking layer is deposited from an aqueous solution or dispersion comprising an ultraviolet light absorbing dye or pigment and a water soluble polymer, followed by drying to remove any excess water and/or organic solvent.

* * * * *